United States Patent [19]

Harlan

[11] Patent Number: 4,577,234
[45] Date of Patent: Mar. 18, 1986

[54] DRIVER AMPLIFIER FOR AN IMAGE DISPLAY DEVICE

[75] Inventor: Wayne E. Harlan, Marion, Ind.

[73] Assignee: RCA Corporation, Princeton, N.J.

[21] Appl. No.: 547,325

[22] Filed: Oct. 31, 1983

[51] Int. Cl.[4] .......................... H04N 5/68; H04N 9/16
[52] U.S. Cl. ...................................... 358/243; 358/65; 358/184
[58] Field of Search .................. 358/243, 184, 74, 65; 330/282

[56] References Cited

U.S. PATENT DOCUMENTS

| 3,588,328 | 6/1971 | Verhoeven et al. ............. 178/5.4 R |
| 4,118,731 | 10/1978 | Hinn ...................................... 358/65 |
| 4,295,160 | 10/1981 | Lagoni ................................. 358/31 |

FOREIGN PATENT DOCUMENTS

| EPA20093904 | 11/1983 | European Pat. Off. . |
| EPA20067585 | 11/1985 | European Pat. Off. . |
| WO81/01783 | 6/1981 | PCT Int'l Appl. . |
| 1137710 | 12/1968 | United Kingdom . |
| 1236832 | 1/1969 | United Kingdom . |
| 1369715 | 2/1972 | United Kingdom . |
| 1428415 | 4/1973 | United Kingdom . |
| 1414773 | 4/1974 | United Kingdom . |
| 2033693 | 10/1979 | United Kingdom . |

OTHER PUBLICATIONS

RCA Projection Television Service Data for Model PGR 200/300 (1982, PTV-3).
Text, "Pulse, Digital and Switching Waveforms" by Millman and Taub (McGraw-Hill), pp. 297-300.

Primary Examiner—Tommy P. Chin
Attorney, Agent, or Firm—P. J. Rasmussen; P. M. Emanuel; R. H. Kurdyla

[57] ABSTRACT

A kinescope driver amplifier includes a signal gain determining feedback network coupled from the output to the input of the amplifier. A normally non-conductive switching network coupled to the feedback network is rendered conductive in response to large amplitude video signals for modifying the impedance of the feedback network so as to reduce the signal gain of the amplifier during the occurence of such large video signals.

13 Claims, 1 Drawing Figure

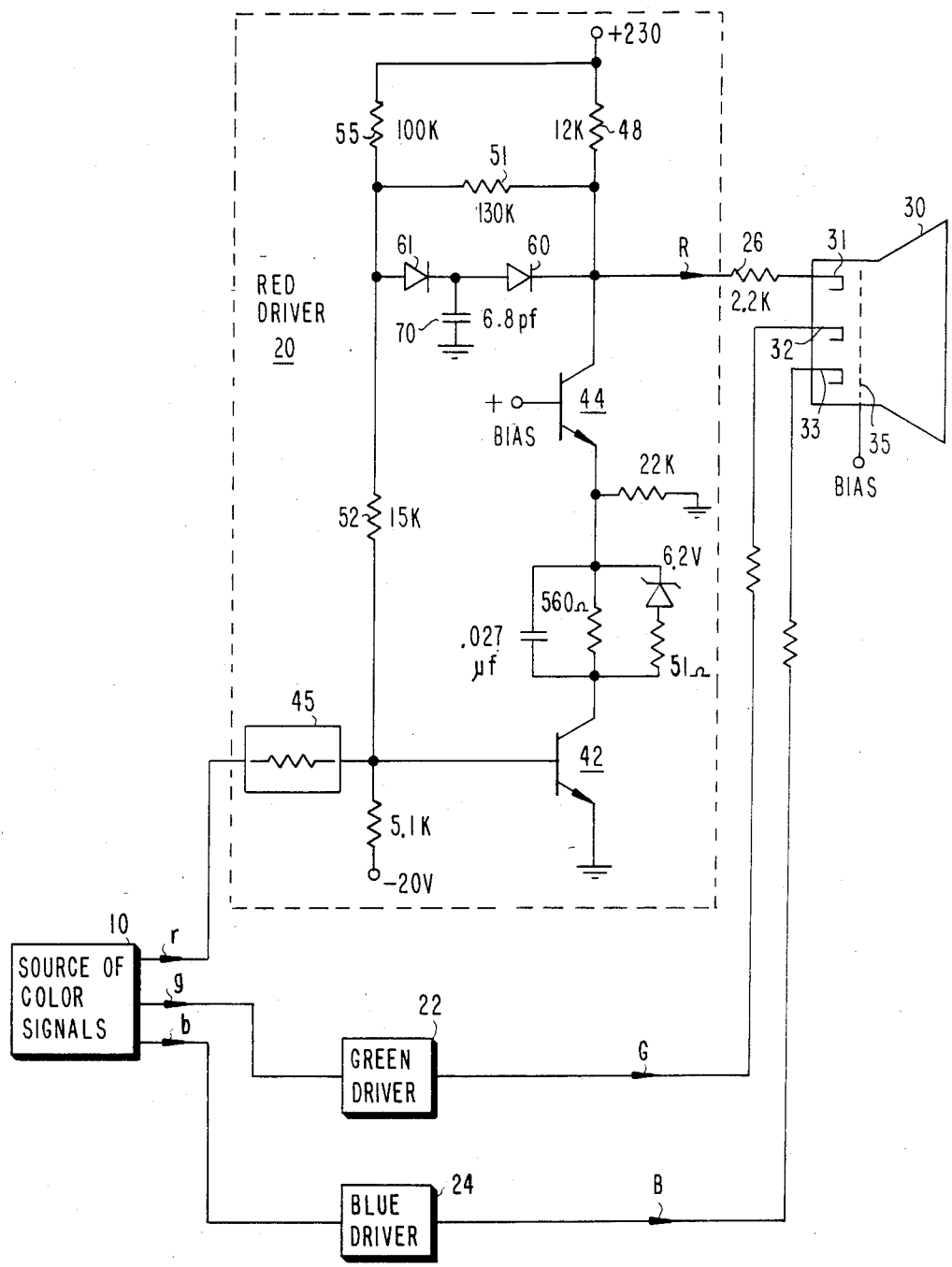

DRIVER AMPLIFIER FOR AN IMAGE DISPLAY DEVICE

This invention concerns an amplifier for providing video drive signals to an image display device such as a kinescope in a color television receiver. In particular, this invention concerns a video driver amplifier with a nonlinear signal gain characteristic.

Plural video driver amplifiers are used to provide high level video signals to intensity control electrodes (e.g., cathodes) of a kinescope in a color television receiver. In some cases the output transistors of the driver amplifiers are subject to conducting in a saturated state in the presence of large amplitude video signals such as may be representative of highly saturated color image areas and peak white image areas, as well as image peaking at the edges of white image areas.

Saturated driver stages can produce an objectionable white or colored image smear following a displayed image area produced by a large amplitude video drive signal. For example, if a white image area is displayed and the red kinescope cathode is biased at a lower potential relative to the green and blue kinescope cathodes, a red color smear following the white image area is likely to be produced as a consequence of the red driver amplifier output transistor exhibiting a saturated conductive state together with the slow "recovery time" of the red output transistor due to transistor charge storage effects. Output transistor saturation ia particularly likely to occur in the case of a driver amplifier arranged as a feedback amplifier, since the lower output impedance and greater output current capability exhibited by a feedback driver amplifier makes it difficult for the output transistor to recover quickly from a saturated condition.

Output transistor saturation can be prevented by restricting the range of video drive signal amplitudes developed at the kinescope cathode. This is undesirable, however, since it would lead to reduced image contrast for all displayed scenes.

Accordingly, pursuant to the principles of the present invention there is disclosed herein a video signal driver amplifier with a non-linear signal gain characteristic, wherein reduced signal gain is exhibited in response to video signals of a magnitude likely to cause saturation of an output transistor associated with the driver stage.

In accordance with a feature of the invention, the driver amplifier comprises a feedback amplifier with a feedback impedance coupled from the signal output to the signal input of the amplifier. A video signal responsive threshold switching network is coupled to the feedback impedance for modifying the value thereof to reduce the amplifier signal gain in the presence of video output signals greater than a given magnitude in a white-going image direction.

The drawing shows a portion of a color television receiver, partly in block form and partly in circuit form, including a video driver amplifier constructed in accordance with the present invention.

A source of color image representative video signals 10 provides low level color signals r, g and b to respective red, green and blue color signal driver amplifier stages 20, 22 and 24 of similar configuration. The structure and operation of red driver amplifier 20, as will be discussed, also apply to green and blue signal drives 22 and 24. High level output color video signals R, G, B from drivers 20, 22, and 24 are coupled via respective current limiting resistors (e.g., resistor 26) to separate red, green and blue cathode electrodes 31, 32, 33 of a color image reproducing kinescope 30. A kinescope control grid 35 is biased in common with respect to each of the cathode electrodes and forms plural kinescope electron guns therewith.

Red driver 20 comprises an input common emitter amplifier transistor 42 arranged in a cascode driver amplifier configuration with an output common base amplifier transistor 44. Input red (r) color signals are coupled to the base input electrode of transistor 42 via an input signal coupling network 45 which may include video signal level shifting circuits, for example. Video output signal R is provided from the collector output circuit of transistor 44 comprising a load resistor 48. A BIAS voltage of approximately +11 volts is applied to the base of transistor 44.

Red driver 20 is arranged as a feedback amplifier and comprises a degenerative feedback path including series feedback resistors 51 and 52 coupled from the collector output of transistor 44 to the base input of transistor 42. The signal gain of driver stage 20 is determined by the ratio of the impedance of the feedback path to the impedance of input coupling circuit 45. The impedance of the feedback path is determined by the values of resistors 51 and 52 in conjunction with the value of a bias resistor 55. Under normal video signal conditions the gain of driver 20 is approximately 50.

Feedback kinescope driver amplifiers are desirable in video signal processing and display systems for several reasons. In addition to assisting to establish the amplifier signal gain, the feedback network also serves to stabilize the DC operating voltage at the amplifier output. The feedback network additionally reduces the amplifier output impedance, thereby improving the amplifier bandwidth and high frequency response by reducing the bandwidth limiting effect of parasitic capacitances associated with the output circuit of the amplifier. The reduced amplifier output impedance also desirably results in greater amplifier output current drive capability. Furthermore, the use of plural feedback resistors such as resistors 51 and 52 with the larger value of such resistors located nearest to the output of the driver amplifier produces the additional benefit of enhancing the high frequency response of the driver amplifier, as discussed in a copending U.S. patent application Ser. No. 515,851 of S.V. Naimpally et al, titled "Wideband Kinescope Driver Amplifier" filed on July 21, 1983.

In accordance with the principles of the present invention, normally non-conductive switching diodes 60 and 61 are connected between the collector output of transistor 44 and the junction of resistors 51, 52 and 55. Thus diodes 60, 61 are coupled across feedback resistor 51.

Video signals appearing at the collector output of transistor 44 exhibit increasingly negative-going amplitudes as video signal image information progresses from black through gray to white image information. Resistor 55 biases the anode of diode 61 such that diodes 60 and 61 are non-conductive for small through moderately large negative going video signal magnitudes at the collector of transistor 44. Very large negative-going video signal magnitudes applied to transistor 44, eg., representative of heavily saturated color image areas and peak white image areas associated with video signal magnitudes in the vicinity of or exceeding 100 IRE units, are capable of causing transistor 44 to conduct in a saturated state. This condition is associated with a transistor 44 collector voltage somewhat less than +30 volts in this example. The recovery time from the saturated state is delayed by transistor charge storage effects and can produce an objectionable image smear following saturated color or peak white image areas. The current limiting resistors (e.g., resistor 26) in the kinescope cathode signal path serve to suppress high currents induced by kinescope arcing. These resistors increase the effective output impedance of the driver stage, which increases the likelihood of the output transistors saturating.

Diodes 60 and 61 are biased so that they conduct in response to a video signal magnitude of approximately +30 volts (with respect to ground) at the collector of transistor 44, which is slightly above (i.e., more positive than) the level at which transistor 44 is expected to saturate. The conduction of diodes 60, 61 prevents transistor 44 from saturating by reducing the gain of driver stage 20. Specifically, when diodes 60, 61 conduct, feedback resistor 51 is bypassed whereby the impedance of the feedback path is reduced, thereby reducing the signal gain of driver stage 20. Thus large amplitude white-going video signals otherwise capable of driving output transistor 44 into saturation are attenuated. Driver 20 therefore exhibits a non-linear signal gain characteristic with a first, normal gain over a first range of video signal magnitudes, and a second, relatively reduced gain in response to very large video signal magnitudes otherwise capable of causing output transistor 44 to saturate.

The bypassing action of conductive diodes 60, 61 can also be accomplished by replacing diodes 60 and 61 with a single diode. However, the use of two series connected diodes such as 60, 61 advantageously serves to reduce by a factor of two the parasitic capacitance of the diode switching network, thereby assisting to preserve the desired bandwidth of the driver stage. In addition, the use of plural switching diodes 60, 61 provides a node at the junction of diodes 60, 61 to which a bypass capacitor 70 can be coupled as shown. Capacitor 70 advantageously bypasses to ground much of the capacitive feedback current to further reduce the effective feedback capacitance and associated bandwidth limiting effects. The capacitive feedback current is the current conducted by the parasitic capacitances which are associated with and appear across diodes 60 and 61. With the value of capacitor 70 of 6.8 picofarads as shown and with diodes 60 and 61 each exhibiting a parasitic capacitance of approximately 3 picofarads, the effective feedback capacitance is a very small 0.7 picofarads.

What is claimed is:

1. A video signal processing system comprising:
   a source of video signals;
   an image display device for displaying video information in response to video signals applied to an intensity control electrode thereof;
   a video output driver amplifier with a signal input coupled to said video signal source and a signal output from which amplified video signals are provided to said intensity control electrode of said display device, said amplifier being subject to exhibiting a saturated state in response to large amplitude video signals processed by said amplifier between said signal input and said signal output; and
   threshold control means coupled to said amplifier and selectively responsive to said video signals processed by said amplifier for reducing the signal gain of said amplifier in response to said large amplitude processed video signals exceeding a threshold level, to preclude said amplifier exhibiting said saturated state.

2. A video signal processing system comprising:
   a source of video signals;
   an image display device for displaying video information in response to video signals applied to an intensity control electrode thereof;
   a video output driver amplifier with a signal input coupled to said video signal source and a signal output from which amplified video signals are provided to said intensity control electrode of said display device; and
   threshold control means coupled to said amplifier and selectively responsive to video signals processed by said amplifier for reducing the signal gain of said amplifier in response to large amplitude video signals exceeding a threshold level; wherein
   a degenerative feedback path is coupled from said amplifier output to said amplifier input; and
   said threshold control means modifies the impedance of said feedback path for effecting said signal gain reduction.

3. Apparatus according to claim 2, wherein
   said feedback path comprises first and second impedance elements; and
   said threshold means is coupled to said first impedance element for modifying the impedance thereof as presented to said feedback path.

4. Apparatus according to claim 3, wherein said threshold means comprises switch means responsive to video signals developed at said amplifier output.

5. Apparatus according to claim 4, wherein
   said switch means is coupled across said first impedance element.

6. Apparatus according to claim 5, wherein
   said switch means comprises semiconductor PN junction means.

7. Apparatus according to claim 5, wherein
   said switch means comprises plural series connected semiconductor PN junction means.

8. Apparatus according to claim 7, wherein
   a capacitor is coupled from a point between said plural semiconductor PN junction means and a reference potential.

9. Apparatus according to claim 3, wherein
   said first and second impedance means respectively comprise first and second resistors; and
   said first resistor has a larger value than said second resistor and is located nearest to said amplifier output.

10. A video signal processing system comprising:
    a source of video signals;
    an image display device for displaying video information in response to video signals applied to an intensity control electrode thereof;
    a video output driver amplifier with a signal input coupled to said video signal source and a signal output from which amplified video signals are provided to said intensity control electrode of said display device; and
    threshold control means coupled to said amplifier and selectively responsive to video signals processed by said amplifier for reducing the signal gain of said amplifier in response to large amplitude video signals exceeding a threshold level; wherein said image display device corresponds to a kinescope with a cathode electrode corresponding to said intensity control electrode;

said amplifier comprises a transistor with a first electrode, and second and third electrodes defining a main signal current conduction path of said transistor;

video output signals are coupled from said second electrode of said transistor to said cathode electrode;

first and second impedance elements comprising a degenerative feedback path for said amplifier are coupled in the order named from said second electrode of said transistor to said third electrode of said transistor; and said threshold control means comprises switch means coupled across said first impedance element and responsive to the magnitude of video output signals developed at said second electrode of said transistor.

11. Apparatus according to claim 10, wherein said switch means comprises plural semiconductor PN junctions coupled in series across said first impedance element; and a capacitor is coupled from a point between said plural semiconductor PN junctions and a reference potential.

12. A video signal processing system comprising:

a source of video signals;

an image display device for displaying video information in response to video signals applied to an intensity control electrode thereof;

a video output driver amplifier with a signal input coupled to said video signal source and a signal output from which amplified video signals are provided to said intensity control electrode of said display device;

feedback means comprising first and second resistors coupled from said amplifier output to said amplifier input, said feedback means exhibiting an impedance related to the values of said first and second resistors; and threshold conduction means coupled to said first resistor and selectively responsive to video signals processed by said amplifier, for selectively reducing the effective value of said first resistor in response to white going magnitides of said video signals exceeding a threshold level.

13. Apparatus according to claim 12, wherein:

said first and second resistors are coupled in the order named from said amplifier output to said amplifier input; and said threshold conduction means is coupled to said amplifier output for responding to the magnitude of output video signals from said amplifier.

* * * * *